(12) United States Patent
Miki et al.

(10) Patent No.: US 9,305,470 B2
(45) Date of Patent: Apr. 5, 2016

(54) CU ALLOY FILM FOR DISPLAY DEVICE AND DISPLAY DEVICE

(75) Inventors: Aya Miki, Kobe (JP); Toshihiro Kugimiya, Kobe (JP); Yasuaki Terao, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 451 days.

(21) Appl. No.: 13/810,949

(22) PCT Filed: Jul. 21, 2011

(86) PCT No.: PCT/JP2011/066614
§ 371 (c)(1),
(2), (4) Date: Jan. 18, 2013

(87) PCT Pub. No.: WO2012/011539
PCT Pub. Date: Jan. 26, 2012

(65) Prior Publication Data
US 2013/0122323 A1  May 16, 2013

(30) Foreign Application Priority Data

Jul. 21, 2010  (JP) ................................. 2010-164385

(51) Int. Cl.
*B32B 17/06* (2006.01)
*B32B 15/04* (2006.01)
(Continued)

(52) U.S. Cl.
CPC ... *G09F 9/30* (2013.01); *C22C 9/00* (2013.01); *C22C 9/01* (2013.01); *C22C 9/04* (2013.01);
(Continued)

(58) Field of Classification Search
USPC ......... 428/426, 432, 433, 688, 689, 697, 699, 428/701, 702
See application file for complete search history.

(56) References Cited

U.S. PATENT DOCUMENTS

| | | |
|---|---|---|
| 6,033,542 A | 3/2000 | Yamamoto et al. |
| 7,098,539 B2 | 8/2006 | Gotoh et al. |

(Continued)

FOREIGN PATENT DOCUMENTS

| | | |
|---|---|---|
| CN | 101395290 A | 3/2009 |
| JP | 2004-133422 A | 4/2004 |

(Continued)

OTHER PUBLICATIONS

International Search Report Issued Aug. 16, 2011 in PCT/JP11/66614 Filed Jul. 21, 2011.

*Primary Examiner* — David Sample
*Assistant Examiner* — Lauren Colgan
(74) *Attorney, Agent, or Firm* — Oblon, McClelland, Maier & Neustadt, L.L.P.

(57) ABSTRACT

The present invention provides a display device which is provided with a Cu alloy film having high adhesion to an oxygen-containing insulator layer and a low electrical resistivity. The present invention relates to a Cu alloy film for a display device, said film having a stacked structure including a first layer (Y) composed of a Cu alloy containing, in total, 1.2-20 atm % of at least one element selected from among a group composed of Zn, Ni, Ti, Al, Mg, Ca, W, Nb and Mn, and a second layer (X) composed of pure Cu or a Cu alloy having Cu as a main component and an electrical resistivity lower than that of the first layer (Y). A part of or the whole first layer (Y) is directly in contact with an oxygen-containing insulator layer (27), and in the case where the first layer (Y) contains Zn or Ni, the thickness of the first layer (Y) is 10-100 nm, and in the case where the first layer (Y) does not contain Zn and Ni, the thickness of the first layer (Y) is 12-100 nm. The present invention also relates to a display device having the Cu alloy film.

19 Claims, 9 Drawing Sheets

(51) Int. Cl.
*G09F 9/30* (2006.01)
*C22C 9/00* (2006.01)
*C22C 9/01* (2006.01)
*C22C 9/04* (2006.01)
*C22C 9/05* (2006.01)
*C22C 9/06* (2006.01)
*C22F 1/08* (2006.01)
*H01L 21/285* (2006.01)
*H01L 21/3205* (2006.01)
*H01L 23/532* (2006.01)
*H01L 29/45* (2006.01)
*H01L 29/49* (2006.01)
*G02F 1/1362* (2006.01)
*C23C 28/00* (2006.01)
*H01L 27/12* (2006.01)
*C23C 14/18* (2006.01)
*H01L 27/32* (2006.01)
*H01L 29/786* (2006.01)

(52) U.S. Cl.
CPC ... *C22C 9/05* (2013.01); *C22C 9/06* (2013.01); *C22F 1/08* (2013.01); *C23C 14/185* (2013.01); *C23C 28/321* (2013.01); *C23C 28/322* (2013.01); *C23C 28/345* (2013.01); *G02F 1/136286* (2013.01); *H01L 21/2855* (2013.01); *H01L 21/32051* (2013.01); *H01L 23/53233* (2013.01); *H01L 23/53238* (2013.01); *H01L 27/124* (2013.01); *H01L 27/1255* (2013.01); *H01L 29/45* (2013.01); *H01L 29/458* (2013.01); *H01L 29/4908* (2013.01); *H01L 29/78669* (2013.01); *G02F 2001/136295* (2013.01); *H01L 27/3279* (2013.01); *H01L 29/7869* (2013.01); *H01L 2924/0002* (2013.01); *Y10T 428/12535* (2015.01); *Y10T 428/12611* (2015.01)

(56) References Cited

U.S. PATENT DOCUMENTS

| | | | |
|---|---|---|---|
| 7,154,180 | B2 | 12/2006 | Gotoh et al. |
| 7,262,085 | B2 | 8/2007 | Gotoh et al. |
| 7,365,810 | B2 | 4/2008 | Gotoh et al. |
| 7,411,298 | B2 | 8/2008 | Kawakami et al. |
| 7,553,754 | B2 | 6/2009 | Gotoh et al. |
| 7,622,809 | B2 | 11/2009 | Gotoh et al. |
| 7,683,370 | B2 | 3/2010 | Kugimiya et al. |
| 7,781,767 | B2 | 8/2010 | Kawakami et al. |
| 7,994,503 | B2 * | 8/2011 | Hino et al. ............ 257/57 |
| 8,535,997 | B2 * | 9/2013 | Kawakami et al. ........ 438/164 |
| 2004/0041958 | A1 | 3/2004 | Hwang et al. |
| 2004/0125257 | A1 | 7/2004 | Chae et al. |
| 2006/0091792 | A1 | 5/2006 | Kugimiya et al. |
| 2006/0275618 | A1 * | 12/2006 | Kugimiya et al. ........ 428/469 |
| 2007/0040172 | A1 | 2/2007 | Kawakami et al. |
| 2007/0295963 | A1 | 12/2007 | Yano et al. |
| 2008/0278649 | A1 * | 11/2008 | Koike .............. H01L 27/12 349/42 |
| 2008/0315203 | A1 | 12/2008 | Hino et al. |
| 2009/0095620 | A1 | 4/2009 | Koike |
| 2009/0173945 | A1 * | 7/2009 | Takasawa et al. ............ 257/66 |
| 2009/0212432 | A1 * | 8/2009 | Koike .................... 257/751 |
| 2009/0253260 | A1 | 10/2009 | Koike |
| 2010/0012935 | A1 * | 1/2010 | Hino et al. ............ 257/57 |
| 2011/0121297 | A1 | 5/2011 | Kawakami et al. |
| 2011/0147753 | A1 * | 6/2011 | Onishi et al. .............. 257/59 |
| 2011/0193088 | A1 | 8/2011 | Mori et al. |
| 2011/0273075 | A1 * | 11/2011 | Goto et al. ............... 313/311 |

FOREIGN PATENT DOCUMENTS

| | | | |
|---|---|---|---|
| JP | 2005-158887 | A | 6/2005 |
| JP | 2006-193783 | A | 7/2006 |
| JP | 4065019 | B2 | 3/2008 |
| JP | 2008-166742 | A | 7/2008 |
| JP | 2008 261895 | | 10/2008 |
| JP | 2009-4518 | A | 1/2009 |
| JP | 2009-185323 | A | 8/2009 |
| JP | 2010-65317 | A | 3/2010 |
| JP | 2010-103324 | A | 5/2010 |
| WO | 2007 100125 | | 9/2007 |
| WO | WO2007100125 | * | 9/2007 |
| WO | 2009 131035 | | 10/2009 |
| WO | 2010 018864 | | 2/2010 |
| WO | WO2010018864 | * | 2/2010 |
| WO | WO2010082637 | * | 7/2010 |

* cited by examiner

CU ALLOY FILM FOR DISPLAY DEVICE AND DISPLAY DEVICE

TECHNICAL FIELD

The present invention relates to a display device including a Cu alloy film, the display device being used for display devices, such as liquid crystal displays and organic EL displays, and specifically, to a display device including a Cu alloy film having excellent adhesion to an oxygen-containing insulator layer.

BACKGROUND ART

Hitherto, aluminum (Al) alloy films have been used for interconnections of display devices, typified by liquid-crystal displays. As progress is made in an increase in the size and quality of display devices, problems of signal delay and power loss due to high wiring resistance are manifested. Thus, copper (Cu) having lower resistance than Al has been receiving attention as a wiring material. Al has an electrical resistivity of $2.5 \times 10^{-6}$ Ω·cm, whereas Cu has a low electrical resistivity of $1.6 \times 10^{-6}$ Ω·cm.

However, it is impossible to ensure sufficient adhesion of Cu to a gate insulating film (typical examples thereof include Si oxides and Si oxynitride, such as SiOx and SiON). That is, Cu has low adhesion to an oxygen-containing insulator layer, thereby disadvantageously causing delamination. Furthermore, Cu has low adhesion to the oxygen-containing insulator layer, so it is difficult to subject Cu to wet etching in order to form an interconnection shape. A main component of a glass substrate is a Si oxide, so there is the same problem as the gate insulating film. To improve adhesion to the glass substrate, various techniques are reported.

For example, PTLs 1 to 3 each disclose a technique for improving adhesion by interposing a high-melting-point metal layer composed of, for example, molybdenum (Mo) or chromium (Cr), between a Cu interconnection and a glass substrate. In these techniques, however, the number of steps of forming the high-melting-point metal layer is increased to increase the production cost of a display device. Furthermore, Cu and the high-melting-point metal (e.g., Mo), which are different metals, are stacked, so that corrosion may occur at the interface between Cu and the high-melting-point metal during wet etching. Moreover, the different metals have different etching rates, thereby disadvantageously failing to form the cross section of an interconnection into a desired shape (e.g., a shape with a taper angle of about 45° to about) 60°. In addition, the electrical resistivity ($12.9 \times 10^{-6}$ Ω·cm) of the high-melting-point metal, such as Cr, is higher than that of Cu, thereby disadvantageously causing signal delay and power loss due to wiring resistance.

PTL 4 discloses a technique in which nickel or a nickel alloy and a polymer-based resin film are interposed as an adhesion layer between a Cu interconnection and a glass substrate. In this technique, however, the resin film may be degraded in a high-temperature annealing step in the production of a display (e.g., liquid-crystal panel) to reduce adhesion.

PTL 5 discloses a technique in which copper nitride serving as an adhesion layer is interposed between a Cu interconnection and a glass substrate. However, copper nitride itself is not a stable compound. Thus, in this technique, N atoms may be released as $N_2$ gas in a high-temperature annealing step in the production of a display (e.g., liquid-crystal panel) to degrade an interconnection film, thereby reducing adhesion.

CITATION LIST

Patent Literature

PTL 1: Japanese Unexamined Patent Application Publication No. 7-66423
PTL 2: Japanese Unexamined Patent Application Publication No. 8-8498
PTL 3: Japanese Unexamined Patent Application Publication No. 8-138461
PTL 4: Japanese Unexamined Patent Application Publication No. 10-186389
PTL 5: Japanese Unexamined Patent Application Publication No. 10-133597

SUMMARY OF INVENTION

Technical Problem

The present invention has been accomplished by focusing attention on the circumstances described above. It is an object of the present invention to provide a display device including a Cu alloy film having high adhesion to an oxygen-containing insulator layer and having low electrical resistivity.

Solution to Problem

The present invention provides a Cu alloy film for a display device and a display device described below.

[1] A Cu alloy film for a display device includes
a stacked structure including a first layer (Y) composed of a Cu alloy that contains at least one element selected from the group consisting of Zn, Ni, Ti, Al, Mg, Ca, W, Nb, and Mn in a total content of 1.2 to 20 atomic percent, and
a second layer (X) composed of pure Cu or a Cu alloy mainly containing Cu, the Cu alloy having lower electrical resistivity than the first layer (Y),
in which the whole or part of the first layer (Y) is in direct contact with an oxygen-containing insulator layer,
when the first layer (Y) contains Zn or Ni, the first layer (Y) has a thickness of 10 nm or more and 100 nm or less, and
when the first layer (Y) does not contain Zn or Ni, the first layer (Y) has a thickness of 5 nm or more and 100 nm or less.

[2] In the Cu alloy film for a display device described in item [1], the thickness of the first layer (Y) is 60% or less of the entire thickness of the Cu alloy film.

[3] In the Cu alloy film for a display device described in item [1] or [2], in the case where the first layer (Y) contains Mn and where the oxygen-containing insulator layer is composed of silicon oxide (SiOx) or silicon oxynitride (SiON) formed by a CVD method, formula (1) described below is satisfied:

$$2 \leq \{[O] \times [Mn] \times 1.6\}/([O]+[N]) \tag{1}$$

wherein in the formula,
[Mn] represents the Mn content (atomic percent) of the first layer (Y),
[O] represents the oxygen (O) content (atomic percent) of the oxygen-containing insulator layer, and
[N] represents the nitrogen (N) content (atomic percent) of the oxygen-containing insulator layer.

[4] In the Cu alloy film for a display device described in any one of items [1] to [3], the first layer (Y) contains Mn, the thickness TM (nm) of the first layer (Y) and the Mn content [Mn] (atomic percent) satisfy formula (2) described below:

$$TM \geq 23 \times \{[Mn] \times 1.6\}^{1.2} \quad (2)$$

wherein in the formula,
TM represents the thickness (nm) of the first layer (Y), and
[Mn] represents the Mn content (atomic percent) of the first layer (Y)

[5] In the Cu alloy film for a display device described in any one of items [1] to [4], the Cu alloy film is heat-treated at 250° C. or higher for 5 minutes or more.

[6] In the Cu alloy film for a display device described in any one of items [1] to [5], the oxygen-containing insulator layer contains Si.

[7] In the Cu alloy film for a display device described in any one of Claims [1] to

[6], the oxide-containing insulator layer is composed of silicon oxide (SiOx) or silicon oxynitride (SiON).

[8] In the Cu alloy film for a display device described in any one of items [1] to [7], the Cu alloy film has excellent wet etching properties.

[9] A display device includes the Cu alloy film for a display device described in any one of items [1] to [8].

Advantageous Effects of Invention

The Cu alloy film for a display device according to the present invention includes a Cu alloy film (interconnection film) having a stacked structure of the first layer (Y) and the second layer (X), the first layer (Y) being composed of a Cu alloy containing a predetermined element having excellent adhesion to the oxygen-containing insulator layer, and the second layer (X) being composed of pure Cu or a Cu alloy having lower electrical resistivity than the first layer (Y). Furthermore, the thickness of the first layer (Y) is appropriately controlled in relation to the element. Thus, high adhesion to the oxygen-containing insulator layer and low electrical resistivity of the entire Cu alloy film are both achieved. With respect to the adhesion, in particular, when the added element in the first layer (Y) is Mn, more good adhesion is achieved by the following method: (I) the thickness of the first layer (Y) and the Mn content of the first layer (Y) are appropriately controlled, and (II) when the oxygen-containing insulator layer is composed of silicon oxide (SiOx) or silicon oxynitride (SiON) formed by a CVD method, the contents of Mn, O, and N in the first layer (Y) are appropriately controlled. Furthermore, the Cu alloy film used in the present invention has a stacked structure including pure Cu and the Cu alloy, which are similar material. Thus, the etching rates are not significantly different from each other. The use of the Cu alloy film enables micro-processing in which patterning is easily performed to provide an excellent shape.

DESCRIPTION OF EMBODIMENTS

Figure 1:
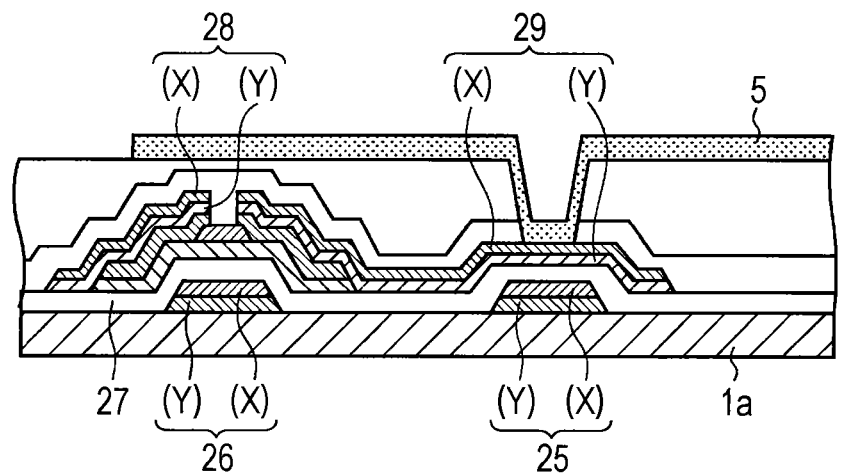
FIG 1 is an explanatory cross-sectional view illustrating a structure of a thin-film transistor (TFT) according to an embodiment of the present invention.

The whole or part of a Cu alloy film for a display device according to the present invention has a stacked structure including a first layer (Y) which is in direct contact with an oxygen-containing insulator layer (hereinafter, also referred to as an "oxygen-containing insulator layer") and which is composed of a Cu alloy that contains at least one element selected from the group consisting of Zn, Ni, Ti, Al, Mg, Ca, W, Nb, and Mn in a total content of 1.2 to 20 atomic percent; and a second layer (X) composed of pure Cu or a Cu alloy having lower electrical resistivity than the first layer (Y), in which when an added element contained in the first layer (Y) is Zn or Ni, the first layer (Y) has a thickness of 10 nm or more and 100 nm or less, and when the added element contained in the first layer (Y) is an element other than Zn or Ni, the first layer (Y) has a thickness of 5 nm or more and 100 nm or less.

In the present invention, the whole or part of the first layer (Y) that is in direct contact with the oxygen-containing insulator layer is composed of the Cu alloy containing an added element that contributes to the improvement of adhesion, thereby improving adhesion to the oxygen-containing insulator layer. The second layer (X) stacked on the first layer (Y) is composed of an element (pure Cu or a Cu alloy having low electrical resistivity comparable to pure Cu) having low electrical resistivity, thereby reducing the electrical resistivity of the entire Cu alloy film. That is, the use of the stacked structure specified by the present invention resolves low adhesion of Cu to the oxygen-containing insulator layer, which is a disadvantage of Cu, while the fact that Cu has lower electrical resistivity than Al, which is an intrinsic property, is effectively maximized.

In the present invention, the type and/or content of the added element of the "Cu alloy constituting the second layer (X) and having lower electrical resistivity than the first layer (Y)" may be appropriately controlled so as to achieve lower electrical resistivity than the first layer (Y) composed of a Cu alloy containing an adhesion-improving element. An element having low electrical resistivity (element having electrical resistivity substantially comparable to a pure Cu alloy) may be easily selected from known elements by reference to values described in literature. However, even if an element having high electrical resistivity is used, it is possible to reduce the electrical resistivity when the content of the element is low (about 0.05 to about 1 atomic percent). Thus, the added element that may be used for the second layer (X) is not necessarily limited to an element having low electrical resistivity. Specifically, for example, Cu-0.5 at. % Ni, Cu-0.5 at. % Zn, and Cu-0.3 at. % Mn are preferably used. The added element that may be used for the second layer (X) may contain a gas component, for example, oxygen gas or nitrogen gas. For example, Cu—O and Cu—N may be used. The Cu alloy having lower electrical resistivity than the first layer (Y) contains the usable element described above and the balance substantially being Cu and incidental impurities.

The first layer (Y) that is the most characteristic feature of the present invention will be described in detail below.

[First Layer (Y)]

In the Cu alloy film described above, the whole or part of the first layer (Y) is in direct contact with the oxygen-containing insulator layer and is composed of a Cu alloy that contains at least one element selected from the group consisting of Zn, Ni, Ti, Al, Mg, Ca, W, Nb, and Mn in a total content of 1.2 to 20 atomic percent. These elements may be contained separately or in combination of two or more. In the case where a single element is contained, the amount of the single element may satisfy the range described above. In the case where two or more elements are contained, the total amount may satisfy the range described above. These elements are selected as elements which form solid solutions with metallic Cu and which do not form solid solutions with a Cu oxide film. It is speculated that in the case where a Cu alloy in which these elements are dissolved is oxidized by, for example, heat treatment during deposition, these elements are dispersed to be concentrated in grain boundaries and interfaces, thereby improving adhesion to the oxygen-containing insulator layer owing to the resulting concentrated layers. The formation of the concentrated layers ensures sufficient adhesion even if the Cu alloy film is directly connected to the oxygen-containing insulator layer without interposing a barrier metal, thereby preventing the degradation of display performance, such as tone representation, of a liquid crystal display.

Among the adhesion-improving elements described above, Mn and Ni are preferred. Mn is more preferred because Mn is an element that exhibits a very strong concentration phenomenon. That is, Mn is transferred from the inside to the outside (for example, the interface to the oxygen-containing insulator layer) of the film by heat treatment (including thermal history in, for example, a step of forming a SiN insulating film in a production process for a display device) during or after the deposition of the Cu alloy film. The transfer of Mn to the interface is further promoted by a driving force resulting from a Mn oxide formed by oxidation due to the heat treatment. It is believed that a Cu—Mn reaction layer (hereinafter, referred to as a "Mn reaction layer") is thus formed at the interface with the oxygen-containing insulator layer, thereby significantly improving adhesion to the oxygen-containing insulator layer (see a photograph of FIG. 11 described below).

Such a concentrated layer, such as the Mn reaction layer, in which at least one element selected from the group consisting of Zn, Ni, Ti, Al, Mg, Ca, W, Nb, and Mn is concentrated in the interface and so forth is preferably produced by forming a Cu alloy film by a sputtering process (details will be described below) and then performing heat treatment at about 250° C. or higher for 5 minutes or more. This is because the heat treatment facilitates the diffusion and concentration of the added element in the interface. The upper limit of the heat treatment conditions is not particularly limited as long as a desired concentrated layer is provided. The upper limit may be appropriately adjusted, depending on the heat resistance of a substrate and the efficiency of a process.

The foregoing heat treatment may be performed in order to form the concentrated layer, such as the Mn reaction layer. Alternatively, the thermal history (for example, a step of forming a protective film, such as a SiN film) after the formation of the Cu alloy film may satisfy the temperature and the time described above.

The content of the foregoing element is 1.2 atomic percent or more. A content of the foregoing element of less than 1.2 atomic percent leads to insufficient adhesion to the oxygen-containing insulator layer, thus failing to provide good properties. For example, at a low content of the foregoing element of about 0.5%, while conditions can lead to good adhesion, reproducibility is low, which will also be described in examples below. In the present invention, the lower limit of the content of the foregoing element is thus 1.2 atomic percent or more in view of reproducibility. In this case, regardless of measurement conditions and so forth, good adhesion is always provided. A higher content of the foregoing element is more effective in improving adhesion. However, a content of the foregoing element exceeding 20 atomic percent results in an increase in the electrical resistivity of the Cu alloy film (interconnection film) itself (first layer +second layer). Furthermore, during the etching of interconnections, the amount of undercut is increased, and residues are formed, thereby causing difficulty in performing micro-processing. From the viewpoint of adhesion described above, the lower limit of the content of the foregoing element is preferably 2 atomic percent, more preferably 3 atomic percent, and still more preferably 4 atomic percent. From the viewpoint of electrical resistivity and so forth, the upper limit is preferably 16 atomic percent, more preferably 14 atomic percent, and still more preferably 12 atomic percent.

Strictly speaking, the preferred content of the foregoing element may vary depending on the type of element. This is because different types of elements have different loads (effects) on adhesion and electrical resistivity. For example, the content of Mn is preferably 3 atomic percent or more and 14 atomic percent or less and more preferably 4 atomic percent or more and 12 atomic percent or less. The content of Zn is preferably 2 atomic percent or more and 10 atomic percent or less.

The first layer (Y) in the Cu alloy film used in the present invention contains the foregoing element (preferably, further contains an element described below) and the balance being Cu and incidental impurities.

The Cu alloy constituting the first layer (Y) may further contain Fe and/or Co. The total content of Fe and/or Co (as the content of the one element when one element out of Fe and Co is contained) may be 0.02 to 1.0 atomic percent. In this case, low electrical resistivity and high adhesion to the oxygen-containing insulator layer are further improved. The content is preferably 0.05 atomic percent or more and 0.8 or less and more preferably 0.1 atomic percent or more and 0.5 atomic percent or less.

In the Cu alloy film, the second layer (X) is provided (directly) on the first layer (Y) and is composed of pure Cu or a Cu alloy mainly containing Cu, the Cu alloy having lower electrical resistivity than the first layer (Y). The arrangement of the second layer (X) results in low electrical resistivity of the entire Cu alloy film. "Mainly containing Cu" in the first layer (Y) indicates that the mass of Cu or the number of Cu atoms is largest in elements constituting the material. From the viewpoint of electrical resistivity, preferably, the content of Cu is substantially 85 atomic percent or more.

As described above, the Cu alloy film used in the present invention has a stacked structure of the second layer (X) and the first layer (Y) that have different compositions, thereby providing desired properties. To more effectively provide the properties, the thickness of the first layer (Y) needs to be appropriately controlled. This is because different types of elements have different effects on adhesion and electrical resistivity.

For example, in the case where the first layer (Y) contains at least Zn or Ni, the lower limit of the thickness is preferably 10 nm or more, more preferably 20 nm or more, and still more preferably 30 nm or more. The upper limit is preferably 100 nm or less and more preferably 80 nm or less.

In the case where the first layer (Y) does not contain Zn or Ni (typically, for example, in the case where the first layer (Y) contains at least Mn), the lower limit of the thickness is preferably 5 nm or more, more preferably 10 nm or more, and still more preferably 15 nm or more. The upper limit is preferably 100 nm or less, more preferably 80 nm or less, and still more preferably 50 nm or less.

The entire thickness of the Cu alloy film (second layer (X)+first layer (Y)) is preferably about 200 nm or more and about 600 nm or less and more preferably 250 nm or more and 400 nm or less.

The thickness of the first layer (Y) is preferably 60% or less of the entire thickness of the Cu alloy film [the total thickness of the second layer (X) and the first layer (Y)]. In this case, low electrical resistivity and high adhesion are provided. Furthermore, micro-processability is more effectively provided. More preferably, the thickness of the first layer (Y) is 50% or less of the entire thickness of the Cu alloy film.

The lower limit of the proportion of the first layer (Y) with respect to the entire thickness of the Cu alloy film is not particularly limited. In view of the improvement of adhesion to the oxygen-containing insulator layer, the lower limit of the proportion of the first layer (Y) is preferably about 15%.

With respect to adhesion, in order to most effectively provide the effect of improving adhesion to the oxygen-containing insulator layer by the formation of the first layer (Y), preferably, the content of the adhesion-improving element and the thickness of the first layer (Y) are not separately controlled but are controlled so as to be correlated with each other. This is because experimental results by the inventors reveal that adhesion to the oxygen-containing insulator layer is closely correlated with the total content of the adhesion-improving element in the first layer (Y). Specifically, the following control is preferably performed: For example, in the case where the content of the element is low, the thickness of the first layer (Y) may be increased. In the case where the thickness of the first layer (Y) is small, the content of the element is increased.

Specifically, for example, in the case where Mn is used as an adhesion-improving element, in order to efficiently form the Mn reaction layer that serves effectively to improve adhesion, the thickness TM (nm) of the first layer (Y) and the Mn content [Mn] (atomic percent) preferably satisfy the relation of formula (2):

$$TM \geq 230 \times \{[Mn] \times 1.6\}^{1.2} \qquad (2)$$

In formula (2), when $TM<230\times\{[Mn]\times1.6\}^{-1.2}$, the amount of Mn adequate to form the Mn reaction layer cannot be supplied from the first layer (Y), thereby possibly leading to insufficient adhesion (see examples described below). With respect to adhesion, the thickness TM of the first layer (Y) may be large as long as the foregoing requirement is satisfied. As described above, however, an excessively large thickness TM may result in an increase in the electrical resistivity of the entire film. In fact, it is thus preferable to appropriately control the range of the thickness TM in view of the balance between the adhesion and the electrical resistivity.

In the case of an embodiment in which Mn is used as the adhesion-improving element as described above and the oxygen-containing insulator layer is composed of silicon oxide (SiOx) or silicon oxynitride (SiON) formed by a CVD method, formula (1) described below is preferably satisfied:

$$2 \leq \{[O] \times [Mn] \times 1.6\}/([O]+[N]) \qquad (1)$$

wherein in the formula,

[Mn] represents the Mn content (atomic percent) of the first layer (Y),

[O] represents the oxygen (O) content (atomic percent) of the oxygen-containing insulator layer, and

[N] represents the nitrogen (N) content (atomic percent) of the oxygen-containing insulator layer.

Formula (1) has been derived from many basic experiments on the basis of the finding that in the case of the embodiment described above, an oxygen (O)—Mn bond contributes to the improvement of adhesion to the oxygen-containing insulator layer. The results of examples described below demonstrated that in the case where the adhesion-improving element is Mn, Mn is believed to be bonded to oxygen (O) (O—Mn bond) in the oxygen-containing insulator layer to improve adhesion and that, in particular, in the case of the oxygen-containing insulator layer composed of silicon oxide (SiOx) or silicon oxynitride (SiON) formed by a CVD method, the effect of improving adhesion was provided at a low temperature, compared with a glass substrate. While the reason for this is not clear in detail, this is presumably because the oxygen-containing insulator layer formed by the CVD method has many defects, so that Mn is easily bonded to oxygen. In the case of the SiON layer formed by the CVD method, Mn is bonded to only oxygen in the SiON layer. Thus, the proportion of Mn which arrives at the interface with the SiON layer and which is bonded to oxygen is [O]/([O]+[N]). To provide the desired effect of improving adhesion, a large amount of Mn is needed, compared with the case where SiOx is used. Formula (1) described above is determined on the basis of the viewpoint.

In formula (1), when the value of $\{[O]\times[Mn]\times1.6/[O]+[N]\})$ is less than 2, the desired effect of improving adhesion may not be provided. From the viewpoint of improving adhesion, a larger value is better. The upper limit of the value is not particularly limited.

To further improve adhesion to the oxygen-containing insulator layer, the first layer (Y) may further contain oxygen. When an appropriate amount of oxygen is incorporated into the first layer (Y) in contact with the oxygen-containing insulator layer, an oxygen-containing layer that contains a predetermined amount of oxygen will be provided at the interface with the oxygen-containing insulator layer, thereby forming a strong bond (chemical bond) with the oxygen-containing insulator layer to improve adhesion.

To adequately provide the effect described above, the amount of oxygen in the first layer (Y) is preferably 0.5 atomic percent or more, more preferably 1 atomic percent or more, even more preferably 2 atomic percent or more, and still even more preferably 4 atomic percent or more. In the case where an excessively large amount of oxygen results in an excessive improvement of adhesion, residues may be left after wet etching to reduce wet etching properties. Furthermore, an excessively large amount of oxygen may result in an increase in the electrical resistivity of the entire Cu alloy film. In consideration of these points of view, the amount of oxygen in the first layer (Y) is preferably 30 atomic percent or less, more preferably 20 atomic percent or less, even more preferably 15 atomic percent or less, and still even more preferably 10 atomic percent or less.

The oxygen-containing first layer (Y) described above is produced by the supply of oxygen gas when the first layer (Y) is formed by sputtering. As a source of oxygen gas, an oxidizing gas containing an oxygen atom (e.g., $O_3$) may be used in addition to oxygen ($O_2$). Specifically, when the first layer (Y) is formed, a mixed gas in which oxygen is added to a process gas commonly used for a sputtering process may be used. When the second layer (X) is formed, sputtering may be performed with a process gas without adding oxygen. This is because the second layer (X) is preferably free of oxygen from the viewpoint of reducing the electrical resistivity. Typical examples of the process gas include rare gases (e.g., xenon gas and argon gas). Argon gas is preferred. A plurality of underlying layers having different oxygen contents can be formed by changing the amount of oxygen gas in the process gas during the formation of the first layer (Y).

The amount of oxygen in the first layer (Y) can be changed, depending on the proportion of oxygen in the process gas. Thus, the proportion may be appropriately changed in response to a desired amount of oxygen. For example, when the first layer (Y) is formed, the concentration of $O_2$ in the process gas (e.g., argon gas) is preferably 1% by volume or more and 20% by volume or less.

As demonstrated in example described below, the Cu alloy film has excellent adhesion to the oxygen-containing insulator layer, typified by a gate insulating film. A material for the oxygen-containing insulator layer used in the present invention is not particularly limited as long as the material is used for a display device. For example, a Si-containing material is used. Silicon oxide (SiOx) or silicon oxynitride (SiON) is preferably used. The oxygen-containing insulator layer may be a single layer or may have a stacked structure. A stacked structure of oxygen-containing insulator layers may be used. Alternatively, a stacked structure of the oxygen-containing insulator layer and another oxygen-free insulator layer may be used. Examples of the stacked structure include $SiO_2$/SiN, SiON/SiN, and $SiO_2$/SiON. The stacked structure may be appropriately adjusted, depending on the production process and properties of a display device.

The oxygen-containing insulator layer is formed, for example, on a substrate. Specifically, the oxygen-containing insulator layer may be formed right above a substrate, i.e., directly on the substrate) or may be formed on a substrate with an oxygen-free insulator layer, such as SiN, or an intermediate layer serving as gate interconnections or the like. In some display devices, the oxygen-containing insulator layer may be formed on the substrate, under the substrate, or on a side surface of the substrate. All embodiments of the oxygen-containing insulator layer used for a display device are within the purport of the present invention. The present invention is not limited to the foregoing descriptions.

A material for the substrate used in the present invention is not limited as long as it is used for a display device. Examples of the substrate include transparent substrates, such as non-alkali glass substrates, high-strain-point glass substrates, and soda-lime glass substrates; thin metal plates composed of Si and stainless steel; and resin substrates, such as PET films.

The Cu alloy film used in the present invention has excellent adhesion to the oxygen-containing insulator layer and thus is preferably used as an interconnection film and an electrode film which come into direct contact with the oxygen-containing insulator layer. For example, in an embodiment of a display device illustrated in FIG. 1 described below, the Cu alloy film may be used for a source electrode integral with a signal line, a drain electrode in contact with a transparent conductive film, and a gate electrode.

The Cu alloy film may also be used as a film for an interconnection or electrode (source-drain electrode) in direct contact with a semiconductor layer of a thin-film transistor (TFT). In the case where Cu is brought into direct contact with a semiconductor layer of a TFT, there are problems in which adhesion of Cu to the semiconductor layer is poor and the interdiffusion between Si of the semiconductor layer and Cu is liable to occur, thereby reducing TFT properties. Thus, a high-melting-point metal film (barrier metal layer) composed of, for example, Mo or Cr, has been interposed in the past. In contrast, the Cu alloy constituting the first layer (Y) also has excellent adhesion to a semiconductor layer. It is thus possible to use a stacked structure in which the Cu alloy constituting the first layer (Y) is provided directly on the semiconductor layer and in which pure Cu or a Cu alloy constituting the second layer (X) is provided. This prevents the foregoing interdiffusion, ensures high adhesion to the semiconductor layer, and achieves low electrical resistivity, without interposing a barrier metal layer. Furthermore, it is possible to perform micro-processing in which patterning is easily performed to provide an excellent shape.

The semiconductor layer is not particularly limited as long as it can be used for a display device. Si-based semiconductors, such as amorphous silicon (a-Si), and oxide semiconductors, such as ZnO, Al-doped ZnO, In—Ga—Zn—O (IGZO), In—Zn—O (IZO), In—Sn—O (ITO), Ga—Zn—O (GZO), Zn—Sn—O (ZTO), In—Zn—Sn—O (IZTO), and Ga—Zn—Sn—O (GZTO), are used. A Si-based semiconductor layer composed of, for example, a-Si, may be used in combination with surface nitridation, such as nitrogen plasma treatment, and a sputtering process, such as a sputtering process with oxygen introduced.

In the case where the Cu alloy film used in the present invention is connected to a semiconductor layer of a TFT, in addition to the foregoing description, after subjecting a surface of the semiconductor layer to nitriding treatment by a plasma nitriding method or the like, the Cu alloy constituting the first layer (Y) and pure Cu or a Cu alloy constituting the second layer (X) may be sequentially formed. That is, a three-layer structure of nitrided semiconductor layer/first layer (Y)/second layer (X) may be used when viewed from the semiconductor layer side. This also ensures high adhesion to the semiconductor layer and ensures low electrical resistivity.

Alternatively, after subjecting a surface of the semiconductor layer to nitriding treatment by a plasma nitriding method or the like, a semiconductor layer is formed again, and the Cu alloy constituting the first layer (Y) and pure Cu or a Cu alloy constituting the second layer (X) may be sequentially formed thereon. That is, a four-layer structure of nitrided semiconductor layer/semiconductor layer/first layer (Y)/second layer (X) may be used when viewed from the semiconductor layer side. This also ensures the same properties as above.

Furthermore, as with the case of the oxygen-containing insulator layer, when the Cu alloy film constituting the first layer (Y) is formed by a sputtering process, a method in which an oxygen-containing first layer (Y) is formed by controlling oxygen gas to interpose an oxygen-containing layer at the interface with the semiconductor layer is also useful. This also achieves the same properties as above. That is, a three-layer structure of semiconductor layer/oxygen-containing first layer (Y)/second layer (X) may be used when viewed from the semiconductor layer side. The semiconductor layer may have a surface subjected to nitriding treatment as described above. Alternatively, a semiconductor layer having a surface subjected to nitriding treatment as described above and a semiconductor layer that is not subjected to nitriding treatment may be stacked. A preferred amount of oxygen in the oxygen-containing first layer (Y) and so forth are the same as above.

The Cu alloy film having the stacked structure is preferably formed by a sputtering process. Specifically, the following process may be employed: After a material constituting the first layer (Y) is deposited by a sputtering process to form the first layer (Y), a material constituting the second layer (X) is deposited thereon to form the second layer (X), thereby forming a stacked structure. After the formation of the Cu alloy stacked film as described above, a predetermined patterning is performed. Then processing is preferably performed in such a manner that the resulting stacked film has a tapered cross-sectional shape with a taper angle of about 45° to about 60° in view of coverage.

The use of the sputtering process can provide a Cu alloy film having a composition substantially the same as a sputtering target. Thus, the composition of the Cu alloy film can be adjusted by adjusting the composition of the sputtering target. The composition of the sputtering target may be adjusted by the use of Cu alloy targets having different compositions or may be adjusted by mounting chips of a metal of an added element on a pure Cu target.

In a spattering process, a slight difference in composition between the deposited Cu alloy film and the sputtering target is caused in some cases. However, the difference is within several atomic percent. Thus, the Cu alloy film having a desired composition can be formed by controlling the composition of the sputtering target in the range of ±10 atomic percent at a maximum.

In the case where the Cu alloy film used in the present invention is provided on a semiconductor layer and used as a source-drain electrode or the like, in order to more effectively suppress interdiffusion with doped amorphous silicon, the employment of a method for suppressing interdiffusion is useful. Examples of the method include a method in which a surface of doped amorphous silicon is nitrided, a method in which doped amorphous silicon is stacked thereon, and a method in which a material constituting the first layer (Y) is deposited by a sputtering process with oxygen introduced, as described above.

The outline of a process for manufacturing a TFT array substrate illustrated in FIG. 1 will be described below with reference to process drawings of FIGS. 2 to 9. Here, an embodiment in which the Cu alloy film of the present invention is used as a source-drain electrode and the Cu alloy film is provided on a gate insulating film (SiOx) serving as the oxygen-containing insulator layer will be described. In the following manufacturing process, the source-drain electrode, excluding a portion in direct contact with a semiconductor layer, is in direct contact with the gate insulating film and thus needs high adhesion to the gate insulating film. In the following description, while silicon oxide (SiOx) is used as the oxygen-containing insulator layer, silicon oxynitride (SiON) may be used.

Here, an amorphous silicon TFT in which the semiconductor layer is composed of hydrogenated amorphous silicon is exemplified as the thin-film transistor formed as a switching element. The present invention is not limited thereto. Polycrystalline silicon may be used. Alternatively, an oxide semiconductor material may be used. The oxide semiconductor material is not particularly limited as long as it can be used as a display device. Typical examples thereof include ZnO, IGZO, ZTO, IZO, ITO, GZO, IZTO, GZTO, and Al-doped ZTO. While FIG. 1 illustrates a TFT array substrate having a bottom-gate structure, the present invention is not limited thereto. For example, the present invention may be applied to a TFT array substrate having a top-gate structure.

Figure 2:
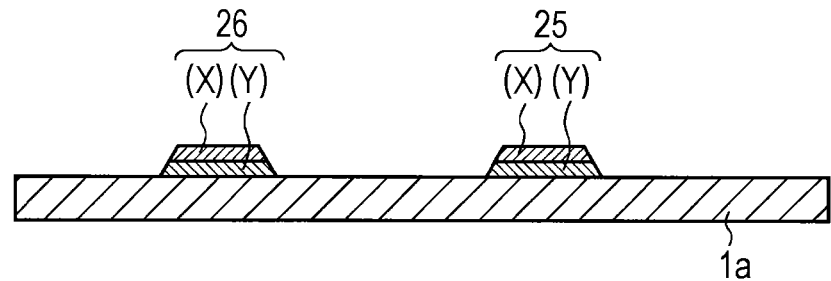
FIG. 2 is an explanatory cross-sectional view sequentially illustrating a process for manufacturing a TFT array substrate according to an embodiment.

The first layer (Y) formed of a Cu alloy thin film having a thickness of, for example, about 100 nm is formed by a method, such as sputtering, on a glass substrate 1a. The second layer (X) formed of pure Cu or a Cu alloy thin film (with a thickness of about 100 nm) having lower electrical resistivity than the first layer is formed thereon by, for example, a sputtering process in such a manner that the total thickness is, for example, about 200 nm. The resulting Cu alloy stacked interconnection film is pattered to form a gate electrode 26 and a scanning line 25 (FIG. 2). At this time, in order to achieve good coverage of the gate insulating film described below, the outer edge of the Cu alloy stacked interconnection film is preferably etched so as to have a tapered shape at a taper angle of about 45° to about 60°.

Figure 3:
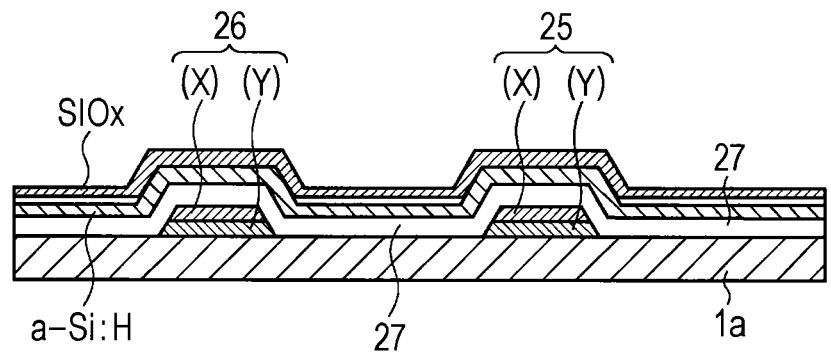
FIG. 3 is an explanatory cross-sectional view sequentially illustrating the process for manufacturing the TFT array substrate according to the embodiment.
Figure 4:
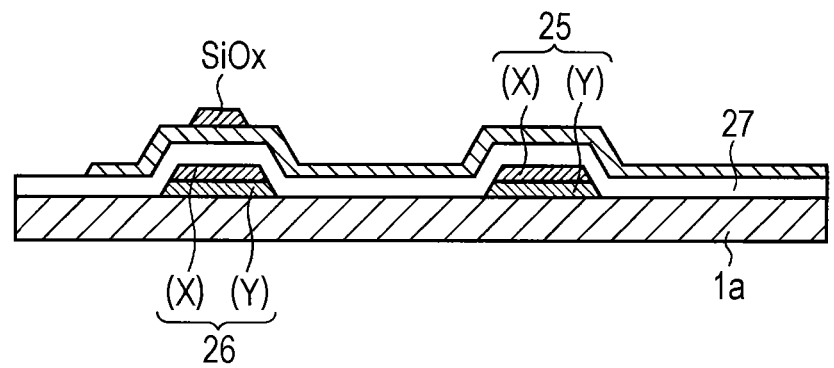
FIG. 4 is an explanatory cross-sectional view sequentially illustrating the process for manufacturing the TFT array substrate according to the embodiment.

As illustrated in FIG. 3, a gate insulating film (silicon oxide film: SiOx) 27 having a thickness of, for example, about 300 nm is formed by, for example, a plasma-enhanced CVD method at a substrate temperature of about 350° C. A hydrogenated amorphous silicon film (a-Si:H) having a thickness of about 150 nm and a silicon oxide film (SiOx) to be formed into a channel protective film are sequentially formed thereon at a substrate temperature of about 300° C. As illustrated in FIG. 4, the silicon oxide film (SiOx) is patterned by back exposure using the gate electrode 26 as a mask to form the channel protective film. Then an about 50-nm-thick $n^+$-hydrogenated amorphous silicon film ($n^+$ a-Si:H) doped with P is formed.

Figure 5:
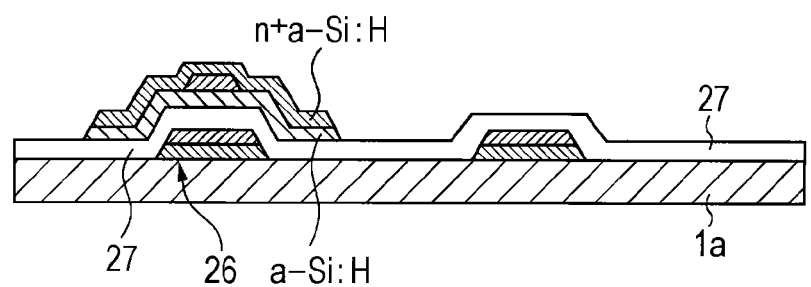
FIG. 5 is an explanatory cross-sectional view sequentially illustrating the process for manufacturing the TFT array substrate according to the embodiment.
Figure 6:
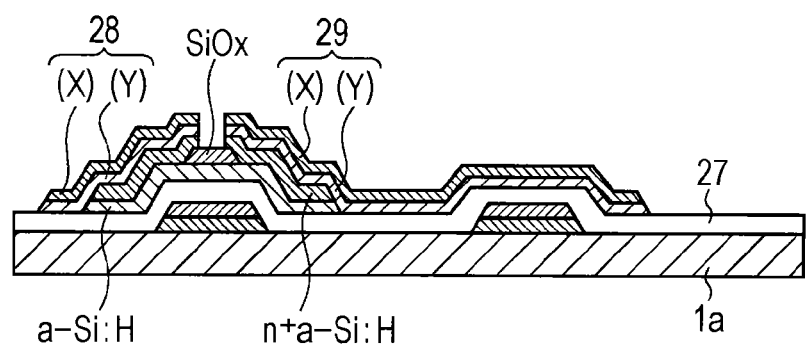
FIG. 6 is an explanatory cross-sectional view sequentially illustrating the process for manufacturing the TFT array substrate according to the embodiment.

As illustrated in FIG. 5, the hydrogenated amorphous silicon film (a-Si:H) and the $n^+$-hydrogenated amorphous silicon film ($n^+$ a-Si:H) are patterned by dry etching. As illustrated in FIG. 6, the first layer (Y) formed of a Cu alloy thin film having a thickness of about 100 nm is formed. The second layer (X) formed of pure Cu or a Cu alloy thin film having lower electrical resistivity than the first layer is stacked thereon by, for example, a sputtering process in such a manner that the total thickness is about 200 nm. The first layer (Y) preferably has a thickness of about 10 to about 50 nm. The second layer (X) preferably has a thickness of about 200 to about 600 nm. The resulting stacked film is patterned by wet etching to form a source electrode 28 integral with a signal line and a drain electrode 29 to be in contact with an ITO transparent conductive film. The $n^+$-hydrogenated amorphous silicon film ($n^+$ a-Si:H) on the channel protective film (SiOx) is removed by dry etching using the source electrode 28 and the drain electrode 29 as a mask.

Figure 7:
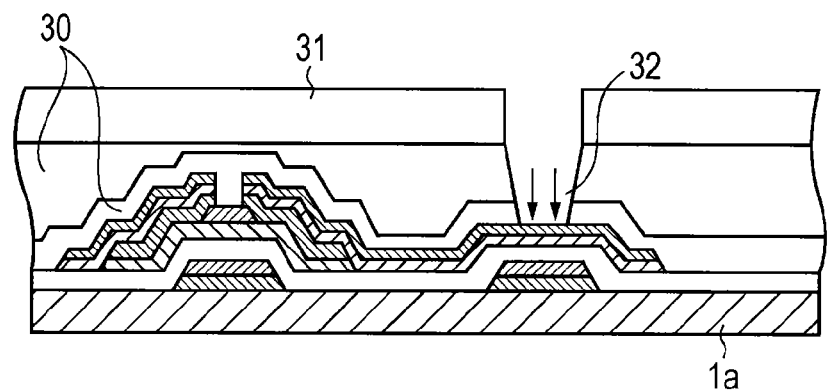
FIG. 7 is an explanatory cross-sectional view sequentially illustrating the process for manufacturing the TFT array substrate according to the embodiment.
Figure 8:
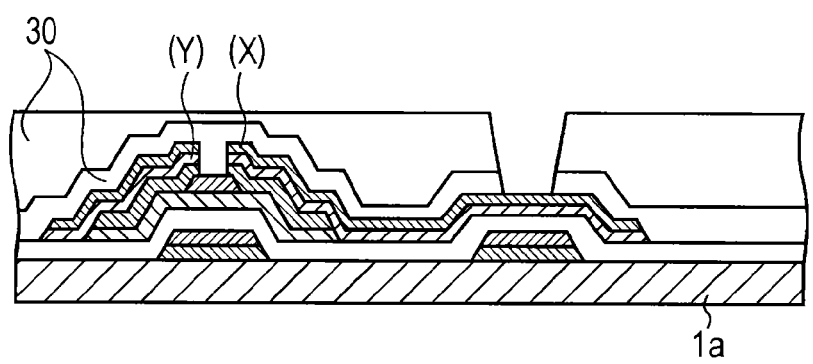
FIG. 8 is an explanatory cross-sectional view sequentially illustrating the process for manufacturing the TFT array substrate according to the embodiment.

As illustrated in FIG. 7, a silicon oxide film (SiOx) 30 having a thickness of about 300 nm is formed with a plasma-enhanced CVD apparatus to form a protective film. In this case, for example, the film formation temperature is preferably about 250° C. A contact hole 32 is formed in the silicon oxide film (SiOx) 30. As illustrated in FIG. 8, a polymer removal step is performed by oxygen plasma ashing. After removal treatment for removing a photoresist 31 is performed with, for example, a non-amine-based remover solution, a Cu oxide film formed by the oxygen plasma ashing is removed with dilute hydrofluoric acid.

Figure 9:
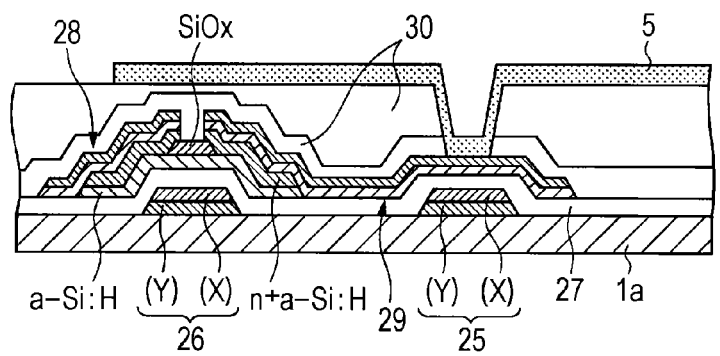
FIG. 9 is an explanatory cross-sectional view sequentially illustrating the process for manufacturing the TFT array substrate according to the embodiment.

As illustrated in FIG. 9, an ITO transparent conductive film having a thickness of, for example, about 150 nm is formed by a sputtering process at room temperature and patterned by wet etching to form a pixel electrode (ITO transparent conductive film) 5, thereby leading to the completion of the TFT array substrate.

In this manufacturing process, the TFT array substrate having the following properties is manufactured: (i) the source-drain electrode is formed and has high adhesion to the oxygen-containing gate insulating film (silicon oxide (SiOx) or silicon oxynitride (SiON)), (ii) the ITO transparent conductive film (pixel electrode) is in direct contact with the drain electrode formed of the Cu alloy stacked film, and (iii) the ITO transparent conductive film is also in direct contact with a TAB portion of the scanning line connected to the gate electrode.

EXAMPLES

While the present invention will be more specifically described below by examples, the present invention is not limited to these examples. Various changes may be made without departing from the scope and spirit of the present invention and all fall within the technical scope of the present invention.

Example 1

(Preparation of Sample)

In this example, for samples (Nos. 3 to 35) made as described below in Table 1, effects of the types and contents of Cu alloys constituting first layers (Y) and thicknesses of the first layers (Y) on electrical resistivity and adhesion to a silicon oxide film (SiOx) were studied.

First, $SiO_2$ films were formed by a plasma-enhanced CVD method on Eagle 2000 (with a diameter of 50.8 mm and a thickness of 0.7 mm, manufactured by Corning Inc). Conditions of the plasma-enhanced CVD method are described below.

Apparatus: PD-200L, manufactured by SAMCO INC.
RF power: 50 W (0.25 W/cm$^2$)
SiH (diluted with 8% Ar):N20=63:460 sccm
Pressure: 80 Pa
Temperature: 300° C.

Next, each of the first layers (Y) was formed on a corresponding one of the $SiO_2$ films. Specifically, Cu alloy films having stacked structures of the first layers (Y) and second layers (X) were formed by a sputtering process as described below, the first layers (Y) being composed of Cu alloys containing various elements illustrated in Tables 1 and 2, and the second layers (X) being composed of pure Cu. In these tables, Nos. 4 to 23 are examples in which Mn is added as an element contained in the first layers (Y). No. 24 is an example in which Bi is added. Nos. 25 to 27 are examples in which Ni is added. Nos. 28 to 30 are examples in which Zn is added. Nos. 31 and 32 are examples in which Al is added. Nos. 33 and 34 are examples in which Ti is added. Nos. 35 and 36 are examples in which Mg is added. Nos. 37 and 38 are examples in which Ca is added. Nos. 39 and 40 are examples in which Nb is added. Nos. 41 and 42 are examples in which W is added. The thickness of an interconnection film was constant and was about 300 nm as a thickness of the entire stacked structure.

Sputtering conditions are described below. Sputtering equipment (trade name: HSM-552, manufactured by Shimadzu Corporation) was used. The stacked interconnection films including the first layers (Y) of the Cu alloy films (with thicknesses described in Table 1) and the second layers (X) of the Cu metal films were formed by a DC magnetron sputtering process (back pressure: $0.27 \times 10^{-3}$ Pa or less, Ar gas pressure: 0.27 Pa, Ar gas flow rate: 30 sccm, sputtering power: DC 260 W, target-substrate distance: 50.4 mm, substrate temperature: room temperature) on the glass substrates (Eagle 2000 (with a diameter of 50.8 mm and a thickness of 0.7 mm), manufactured by Corning Inc).

Furthermore, a sample (No. 43) in which an oxygen-containing layer was formed on the $SiO_2$ film was produced. Here, the oxygen-containing layer was formed with a mixed gas of Ar and $O_2$ serving as a process gas, the proportion of oxygen gas in the mixed gas being adjusted to 10% by volume.

Other deposition conditions are described below.
Back pressure: $1.0 \times 10^{-6}$ Torr or less
Process gas pressure: $2.0 \times 10^{-3}$ Torr
Process gas flow rate: 30 sccm
Sputtering power: 3.2 W/cm$^2$
Target-substrate distance: 50 mm
Deposition temperature: room temperature Compositions of the resulting Cu alloy films were identified through quantitative analyses with an inductively coupled plasma (ICP)-emission spectrophotometer (ICP Atomic Emission Spectrophotometer "Model ICP-8000" manufactured by Shimadzu Corporation).

For comparison purposes, samples (Nos. 1 and 2) each including pure Cu sandwiched by barrier metal layers of Mo or Ti and a sample (No. 3) consisting of pure Cu alone were prepared.

These samples were used to study the electrical resistivity of the Cu alloy films and adhesion to the $SiO_2$ films.
(1) Measurement of Electrical Resistance Each of the Cu alloy stacked interconnection films formed on the glass substrates (Eagle 2000 (with a diameter of 50.8 mm and a thickness of 0.7 mm), manufactured by Corning Inc.) was processed into an electrical resistivity evaluation pattern having a line width of 100 μm and a line length of 10 mm by photolithography and wet etching. In this case, an etching solution for Cu (Cu-02, supplied from Kanto Chemical Co., Inc.) was used as a wet etchant. The substrate was subjected to vacuum heat treatment (degree of vacuum: $0.27 \times 10^{-3}$ Pa or less) by heating the substrate at 350° C. for 30 minutes with a single-wafer-processing CVD apparatus. The electrical resistance after the vacuum heat treatment was measured by a direct-current four-point probe method at room temperature.

In Example 1, the pass-fail criteria for electrical resistivity are described below. Pass (O): a sample having an electrical resistivity equal to or lower than 3.5 μΩ·cm, which is comparable to the electrical resistivity of a conventional Cu-based material. Fail (×): a sample having an electrical resistivity exceeding 3.5 μΩ·cm.
(2) Evaluation of Adhesion to $SiO_2$ Film After heat treatment (270° C. for 5 minutes under a nitrogen flow), the adhesion of the Cu alloy film was evaluated by a cross-cut tape test. Specifically, lines each 1 mm apart were scored on a surface of each Cu alloy film to create a grid with a cutter knife. A black polyester tape (model: 8422B, manufactured by Sumitomo 3M Limited) was firmly adhered to the surface of the film, and then removed in a single motion while the peeling angle of the tape was kept to 60°. The number of squares that was not detached with the tape was counted, and the ratio of this number to the total number of squares (film residual ratio) was determined. The measurement was performed three times. The average of the three measurements was defined as the film residual ratio of each sample.

In this example, a peeling ratio with the tape of 0% or more and less than 10% was rated as ⊙, a peeling ratio of 10% or more and less than 20% was rated as ○, and a peeling ratio of 20% or more was rated as ×. ⊙ and ○ were rated as "Pass" (good adhesion to the SiO₂ film). As a comprehensive evaluation, a sample in which the adhesion and the electrical resistivity were rated as "Pass" was rated as ○, and others were rated as ×.

(3) Evaluation of Wet Etching Properties

For each of the samples, the Cu alloy film was formed into a 10-μm line-and-space pattern by photolithography and then etched with an etching solution for Cu (Cu-02, supplied from Kanto Chemical Co., Inc). The etched sample was observed with an optical microscope from above. A sample including the underlying layer having a step length of 3 μm or less was rated as ○ (good wet etching properties), and a sample including the underlying layer having a step length exceeding 3 μm was rated as × (poor wet etching properties). Here, the step length indicates a length from an end portion of the second layer (X) to an end portion of the first layer (Y) during the processing of the interconnections.

These results are described in Tables 1 and 2.

TABLE 1

| No. | Composition of first layer (Y) (at. %) | Thickness of first layer (nm) | Composition of second layer (X) (at. %) | Total thickness (nm) | Proportion of first layer (Y) (%) | Adhesion Peeling ratio after heat treatment at 270° C. | Electrical resistivity After heat treatment at 350° C. (μΩ·cm) | Evaluation | Wet etching properties | Comprehensive evaluation | Value of formula (1) | Value of formula (2) |
|---|---|---|---|---|---|---|---|---|---|---|---|---|
| 1 | Mo (20 nm)/Pure Cu (260 nm)/Mo (20 nm) | | | | | ⊙ | 2.8 | ○ | X | X | — | — |
| 2 | Ti (20 nm)/Pure Cu (260 nm)/Ti (20 nm) | | | | | ⊙ | 3 | ○ | X | X | — | — |
| 3 | Pure Cu (300 nm) | | | | | X | 2.1 | ○ | ○ | X | — | — |
| 4 | Cu—0.1Mn | 20 | Pure Cu | 300 | 7 | X | 2.2 | ○ | ○ | X | 0.16 | 2073 |
| 5 | Cu—0.1Mn | 150 | Pure Cu | 300 | 50 | X | 2.3 | ○ | ○ | X | 0.16 | 2073 |
| 6 | Cu—0.1Mn | 200 | Pure Cu | 300 | 67 | X | 2.3 | ○ | ○ | X | 0.16 | 2073 |
| 7 | Cu—0.5Mn | 5 | Pure Cu | 300 | 2 | X | 2.2 | ○ | ○ | X | 0.8 | 301 |
| 8 | Cu—0.5Mn | 20 | Pure Cu | 300 | 7 | ○ | 2.3 | ○ | ○ | X* | 0.8 | 301 |
| 9 | Cu—0.5Mn | 50 | Pure Cu | 300 | 17 | ○ | 2.3 | ○ | ○ | X* | 0.8 | 301 |
| 10 | Cu—2.0Mn | 5 | Pure Cu | 300 | 2 | X | 2.2 | ○ | ○ | X | 3.2 | 57 |
| 11 | Cu—2.0Mn | 20 | Pure Cu | 300 | 7 | ⊙ | 2.6 | ○ | ○ | ○ | 3.2 | 57 |
| 12 | Cu—2.0Mn | 50 | Pure Cu | 300 | 17 | ⊙ | 2.8 | ○ | ○ | ○ | 3.2 | 57 |
| 13 | Cu—2.0Mn | 100 | Pure Cu | 300 | 33 | ⊙ | 3.2 | ○ | ○ | ○ | 3.2 | 57 |
| 14 | Cu—5.0Mn | 5 | Pure Cu | 300 | 2 | ○ | 2.4 | ○ | ○ | ○ | 8 | 19 |
| 15 | Cu—5.0Mn | 20 | Pure Cu | 300 | 7 | ⊙ | 2.8 | ○ | ○ | ○ | 8 | 19 |
| 16 | Cu—5.0Mn | 50 | Pure Cu | 300 | 17 | ⊙ | 3.1 | ○ | ○ | ○ | 8 | 19 |
| 17 | Cu—5.0Mn | 100 | Pure Cu | 300 | 33 | ⊙ | 3.3 | ○ | ○ | ○ | 8 | 19 |
| 18 | Cu—10Mn | 10 | Pure Cu | 300 | 3 | ⊙ | 2.4 | ○ | ○ | ○ | 16 | 8 |
| 19 | Cu—10Mn | 20 | Pure Cu | 300 | 7 | ⊙ | 2.5 | ○ | ○ | ○ | 16 | 8 |
| 20 | Cu—10Mn | 50 | Pure Cu | 300 | 17 | ⊙ | 2.7 | ○ | ○ | ○ | 16 | 8 |
| 21 | Cu—20Mn | 5 | Pure Cu | 300 | 2 | ⊙ | 2.4 | ○ | ○ | ○ | 32 | 4 |
| 22 | Cu—20Mn | 20 | Pure Cu | 300 | 7 | ⊙ | 2.6 | ○ | ○ | ○ | 32 | 4 |
| 23 | Cu—20Mn | 50 | Pure Cu | 300 | 17 | ⊙ | 2.8 | ○ | ○ | ○ | 32 | 4 |

*Nos. 8 and 9 were rated as "X" because of lack of reproducibility in adhesion.

TABLE 2

| No. | Composition of first layer (Y) (at. %) | Thickness of first layer (nm) | Composition of second layer (X) (at. %) | Total thickness (nm) | Proportion of first layer (Y) (%) | Adhesion Peeling ratio after heat treatment at 270° C. | Electrical resistivity After heat treatment at 350° C. (μΩ·cm) | Evaluation | Wet etching properties | Comprehensive evaluation |
|---|---|---|---|---|---|---|---|---|---|---|
| 24 | Cu—2.0Bi | 50 | Pure Cu | 300 | 17 | X | 6.2 | X | ○ | X |
| 25 | Cu—2.0Ni | 10 | Pure Cu | 300 | 3 | ○ | 2.4 | ○ | ○ | X |
| 26 | Cu—2.0Ni | 50 | Pure Cu | 300 | 17 | ○ | 2.9 | ○ | ○ | ○ |
| 27 | Cu—5.0Ni | 50 | Pure Cu | 300 | 17 | ○ | 3.3 | ○ | ○ | ○ |
| 28 | Cu—2.0Zn | 10 | Pure Cu | 300 | 3 | ○ | 2.5 | ○ | ○ | X |
| 29 | Cu—2.0Zn | 50 | Pure Cu | 300 | 17 | ○ | 3.0 | ○ | ○ | ○ |
| 30 | Cu—5.0Zn | 50 | Pure Cu | 300 | 17 | ○ | 3.3 | ○ | ○ | ○ |
| 31 | Cu—2.0Al | 50 | Pure Cu | 300 | 17 | ○ | 2.7 | ○ | ○ | ○ |
| 32 | Cu—5.0Al | 50 | Pure Cu | 300 | 17 | ○ | 3.5 | ○ | ○ | ○ |
| 33 | Cu—2.0Ti | 50 | Pure Cu | 300 | 17 | ○ | 2.8 | ○ | ○ | ○ |
| 34 | Cu—5.0Ti | 50 | Pure Cu | 300 | 17 | ○ | 3.5 | ○ | ○ | ○ |
| 35 | Cu—2.0Mg | 50 | Pure Cu | 300 | 17 | ○ | 2.4 | ○ | ○ | ○ |
| 36 | Cu—5.0Mg | 50 | Pure Cu | 300 | 17 | ○ | 3.2 | ○ | ○ | ○ |
| 37 | Cu—2.0Ca | 50 | Pure Cu | 300 | 17 | ○ | 2.5 | ○ | ○ | ○ |
| 38 | Cu—5.0Ca | 50 | Pure Cu | 300 | 17 | ○ | 3.3 | ○ | ○ | ○ |

TABLE 2-continued

| No. | Composition of first layer (Y) (at. %) | Thickness of first layer (nm) | Composition of second layer (X) (at. %) | Total thickness (nm) | Proportion of first layer (Y) (%) | Adhesion Peeling ratio after heat treatment at 270° C. | Electrical resistivity After heat treatment at 350° C. (μΩ·cm) | Evaluation | Wet etching properties | Comprehensive evaluation |
|---|---|---|---|---|---|---|---|---|---|---|
| 39 | Cu—2.0Nb | 50 | Pure Cu | 300 | 17 | ◯ | 2.8 | ◯ | ◯ | ◯ |
| 40 | Cu—5.0Nb | 50 | Pure Cu | 300 | 17 | ◯ | 3.4 | ◯ | ◯ | ◯ |
| 41 | Cu—2.0W | 50 | Pure Cu | 300 | 17 | ◯ | 2.8 | ◯ | ◯ | ◯ |
| 42 | Cu—5.0W | 50 | Pure Cu | 300 | 17 | ◯ | 3.4 | ◯ | ◯ | ◯ |
| 43 | Pure Cu (225 nm)/10% oxygen-containing Cu—1.0Mn (75 nm) | | | | | ⊙ | 2.8 | ◯ | ◯ | ◯ |

Nos. 11 to 23 (examples in which Mn is added as an element contained in the first layers (Y)), Nos. 25 to 27 (examples of Ni addition), Nos. 28 to 30 (examples of Zn addition), Nos. 31 and 32 (examples of Al addition), Nos. 33 and 34 (examples of Ti addition), Nos. 35 and 36 (examples of Mg addition), Nos. 37 and 38 (examples of Ca addition), Nos. 39 and 40 (examples of Nb addition), and Nos. 41 and 42 (examples of W addition) satisfied the requirements of the present invention and thus achieved low electrical resistivity, high adhesion to the $SiO_2$ film, and good wet etching properties.

In contrast, Nos. 1 and 2 were examples, in which the barrier metal layers of Mo or Ti were interposed, and had low electrical resistivity and high adhesion to the $SiO_2$ film. However, the wet etching properties were reduced. No. 3 in Table 1 was an example consisting of a pure Cu single layer and had low electrical resistivity and excellent wet etching properties. However, the adhesion to the $SiO_2$ film was not enough.

Nos. 4 to 7 and 10 were examples in which Mn was contained of the first layer (Y). In any case, the Mn content was as low as 0.1 to 0.5 atomic percent. Thus, regardless of how the thickness of the first layer (Y) was controlled and how the proportion of the first layer (Y) to the total thickness was controlled, the adhesion to the $SiO_2$ film was reduced.

Nos. 8 and 9 were examples in which Mn was contained of the first layer (Y) and the Mn content was as low as 0.5 atomic percent. In this example, good adhesion was revealed (the column of the evaluation of adhesion: ◯). However, for these examples, in a test of Example 2 described below, the adhesion was determined to be insufficient at a Mn content of 0.5 atomic percent. The comprehensive evaluation was rated as "×" because of lack of reproducibility.

No. 24 was an example in which Bi, which is an added element that is not specified by the present invention, was contained. A reduction in adhesion to the $SiO_2$ film and an increase in electrical resistivity were observed.

No. 43 was an example in which oxygen was contained in the first layer (Y). Even when the Mn content was lower than the range specified by the present invention, good adhesion was achieved.

Example 2

In this example, Mn was contained of the first layer (Y). The effects of the Mn content and the thickness of the first layer (Y) on adhesion to the $SiO_2$ film and the electrical resistivity were studied in more detail.

(1) Evaluation of Adhesion to $SiO_2$ Film

Stacked films of the first layers (Y) and the second layers (X) were formed on the $SiO_2$ films as in Example 1, except that glass substrates EAGLE 2000 manufactured by Corning Inc. (with a diameter of 4 inches and a thickness of 0.7 mm) were used and that the thickness of the first layers (Y) was changed within the range of 5 to 100 nm and the thickness of the second layers (X) was fixed to 500 nm. After the deposition, heat treatment was performed at 270° C. for 5 minutes with a CVD apparatus under a nitrogen atmosphere at 1 Pa. Next, lines each 1 mm apart were scored on a surface of each Cu alloy film to create a 5×5 grid with a utility knife. A tape (model: 8422B, manufactured by Sumitomo 3M Limited) was firmly adhered to the surface of the film, and then removed in a single motion by pulling at an angle of 60° relative to the $SiO_2$ film. In this example, a sample in which at least one square was detached was rated as "Fail (×)", and a sample in which no square was detached was rated as "Pass (◯)".

Figure 10:
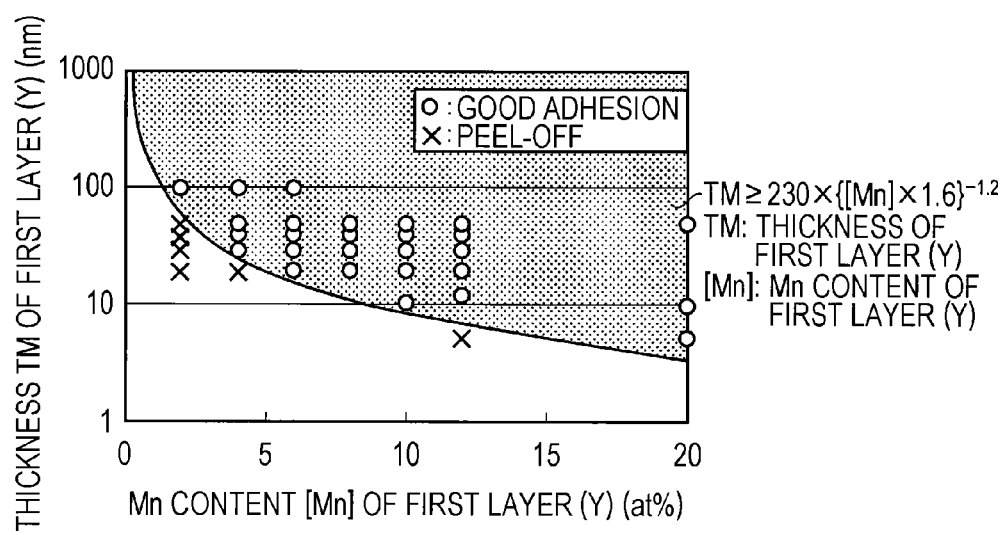
FIG. 10 is a graph illustrating the effects of the Mn content (atomic percent) of a first layer (Y) and the thickness (nm) of the first layer on adhesion.

The results were described in Table 3 and FIG. 10.

TABLE 3

| | | Content of Mn in first layer (Y) (at. %) | | | | | | |
|---|---|---|---|---|---|---|---|---|
| | | 2 | 4 | 6 | 8 | 10 | 12 | 20 |
| Thickness of first layer (Y) (nm) | 5 | | | | | | X | ◯ |
| | 10 | | | | | ◯ | | ◯ |
| | 12 | | | | | | ◯ | |
| | 20 | X | X | ◯ | ◯ | ◯ | ◯ | |
| | 30 | X | ◯ | ◯ | ◯ | ◯ | ◯ | |
| | 40 | X | ◯ | ◯ | ◯ | ◯ | ◯ | ◯ |
| | 50 | X | ◯ | ◯ | ◯ | ◯ | ◯ | |
| | 100 | ◯ | ◯ | ◯ | | ◯ | | |

(◯: good adhesion, X: peel-off)

From Table 3 and FIG. 10, in order to improve the adhesion of the first layer (Y) to the $SiO_2$ film, it is effective to correlatively control the Mn content of the first layer (Y) and the thickness of the first layer (Y). Furthermore, there is a tendency to improve adhesion by increasing the thickness when the Mn content is low and by increasing the Mn content when the thickness is small. This tendency is organized into relational formula (2) described below. When relational formula (2) is satisfied, good adhesion is provided:

$$TM \geq 230 \times \{[Mn] \times 1.6\}^{-1.2} \quad (2)$$

wherein in the formula,

TM represents the thickness (nm) of the first layer (Y), and [Mn] represents the Mn content (atomic percent) of the first layer (Y).

In the evaluation of the adhesion in Example 1, all of the samples having a peeling ratio with the tape of 0% or more and less than 10% are rated as ⊙. In Example 2, a sample in which at least one square is detached is rated as "Fail (×)". The evaluation in Example 2 is stricter than that in Example 1. That is, among the samples rated as ⊙ in Example 1, the samples that satisfy $TM \geq 230 \times \{[Mn] \times 1.6\}^{-1.2}$ (Nos. 13, 15, 16, 17, 18, 19, 20, 21, 22, and 23 in Table 1) correspond to the examples in which no square is detached. The samples that do not satisfy the forgoing relational formula (Nos. 11 and 12 in Table 1) correspond to the examples that are detached at a peeling ratio of less than 10%.

Figure 11:
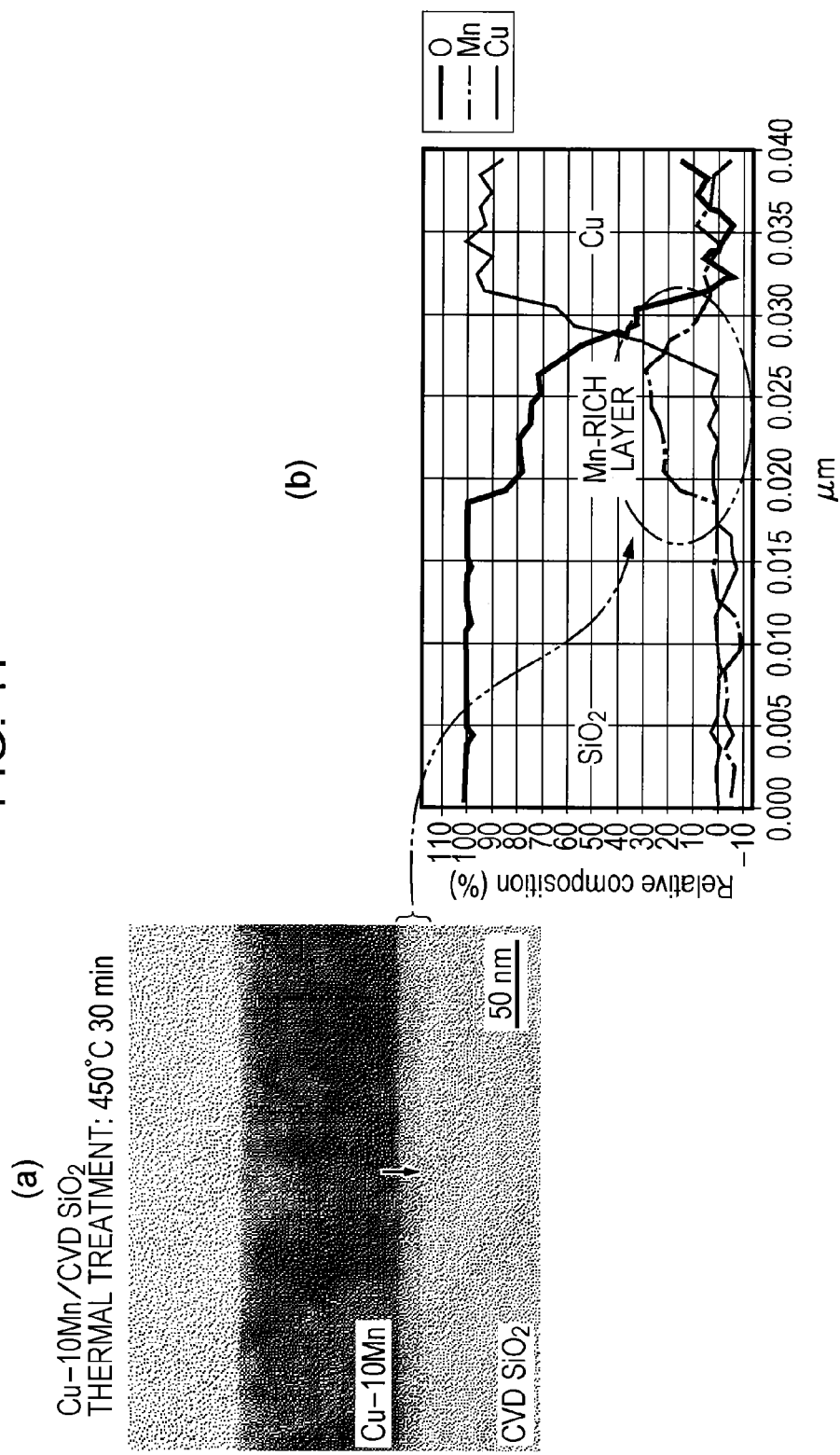
FIG. 11($a$) is a TEM image illustrating a state of the interface between the first layer (Y) and an oxygen-containing insulator layer according to an embodiment of the present invention, and FIG. 11($b$) illustrates the results of analysis of the concentration profile of a film in the depth direction by TEM-EDX.

Here, with respect to a sample which has a Mn content of 10 atomic percent and a thickness of the first layer (Y) of 100 nm and which is subjected to heat treatment at 450° C. for 30 minutes, a TEM image of the interface between the SiO$_2$ film and the first layer (Y) is illustrated in the left figure of FIG. 11, and the results of analysis of the concentration profile of the film in the depth direction by TEM-EDX are illustrated in the right figure of FIG. 11. FIG. 11 demonstrated that a Mn reaction layer (Mn-rich layer) having a high Mn content was formed at the interface. In this example, the heat treatment was performed at 270° C. for 5 minutes. Here, in order to more clarify the change of an interface structure due to the heat treatment, the TEM image after the heat treatment at 450° C. for 30 minutes was illustrated. Of course, even when the heat treatment is performed under the conditions in this example, a similar Mn reaction layer is also formed.

Figure 12:
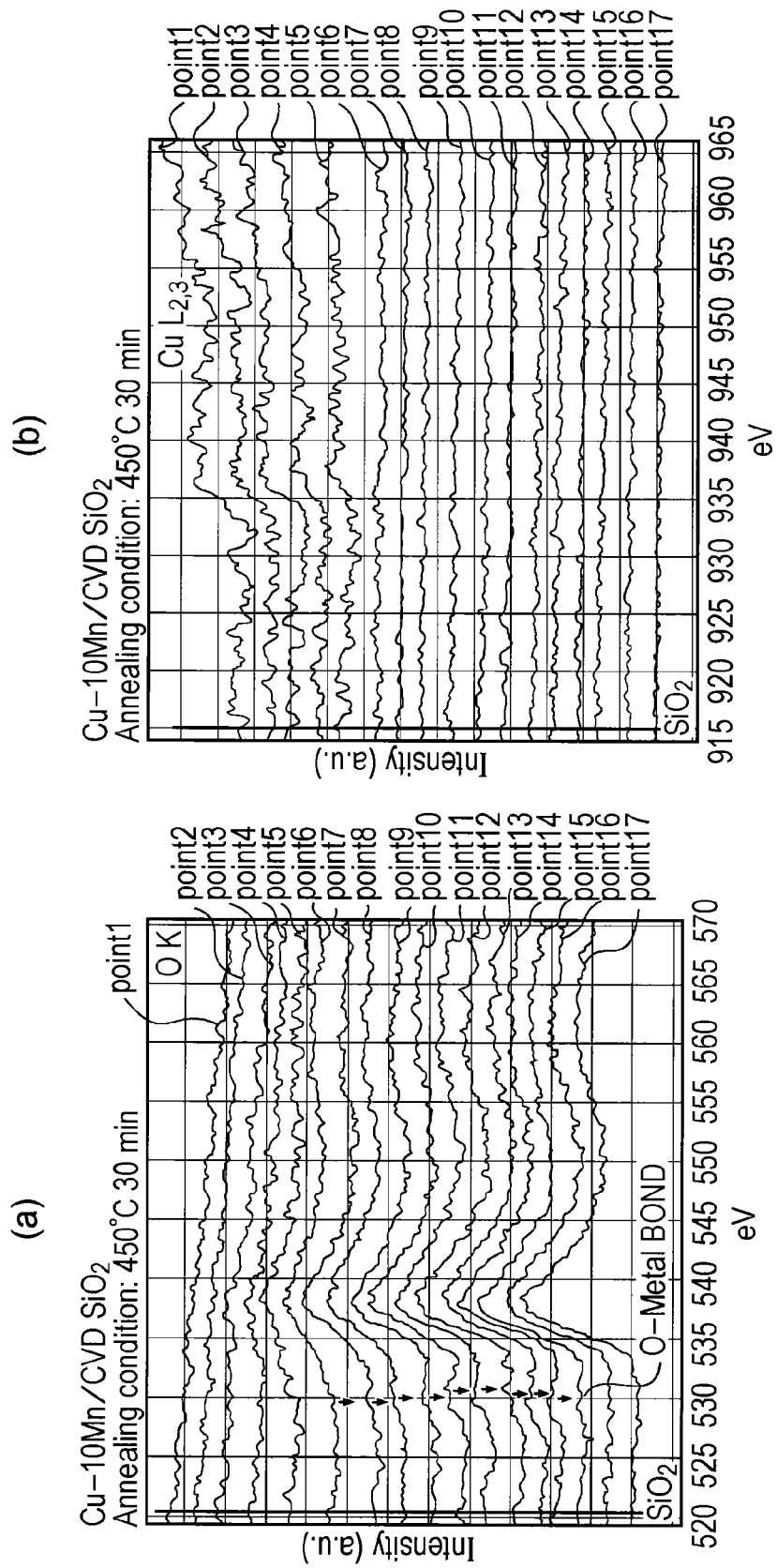
FIGS. 12($a$) and 12($b$) are graphs each illustrating a concentration profile in the vicinity of the interface between the first layer (Y) and the oxygen-containing insulator layer according to an embodiment of the present invention, FIG. 12($a$) illustrates the analytical results of oxygen (O), and FIG. 12($b$) illustrates the analytical results of Cu.

With respect to the sample, the results of analysis by electron energy loss spectroscopy (EELS) are illustrated in FIG. 12. The EELS analysis is a powerful technique that enables an elemental analysis and so forth in nanometer-scale spatial resolution and can analyze the bonding state on the order of nanometers by, for example, adjusting measuring conditions. In this example, EELS line analysis was performed under conditions described below. In this case, the results of analysis are illustrated when the thickness from a Cu-10 at. % Mn film to SiO$_2$ was divided into 17 segments (points 1 to 17) in the depth direction.

Observation apparatus: field emission type scanning transmission electron microscope "JEM-2100F" manufactured by JEOL Ltd.
    Accelerating voltage: 200 kV
    EELS analyzer: Tridiem manufactured by Gatan Inc.
    Dispersion: 0.3 eV/ch FIG. 12(a) illustrates the results of analysis of oxygen (O). As illustrated in FIG. 12(a), a peak that suggests an O-Metal bond was observed at about 530 eV (see arrows in the figure). The peak is not observed in SiO$_2$. However, the type of metal bonded to O cannot be identified from the results alone.

FIG. 12(b) illustrates the results of analysis of Cu. As illustrated in FIG. 12(b), it is found that substantially flat intensity is observed at each of points 6 to 17, whereas the flatness is significantly lost at points 1 to 5 at about 935 eV or more. The results demonstrated that the peak of the O-metal bond (about 530 eV) and the Cu peak do not coexist and that O is bonded to Mn.

(2) Measurement of Electrical Resistance

The same samples as the forgoing samples used for the evaluation of adhesion were used, and the electrical resistance was measured as in Example 1. The electrical resistivity was determined by measuring the sheet resistance of each Cu alloy film by a direct-current four-point probe method and converting the sheet resistance into the electrical resistivity. The results demonstrated that in Example 2, each of the samples had low electrical resistivity within the practicable range.

Example 3

In this example, wet etching properties of samples produced as described below were studied.

Stacked films of the first layers (Y) and the second layers (X) were formed on the SiO$_2$ films as in Example 2, except that Cu alloy films including the first layers (Y) composed of Cu alloys containing various elements illustrated in Table 4 and the second layers (X) composed of pure Cu were formed so as to have thicknesses described in Table 4.

The resulting samples were etched as in Example 1. The wet etching properties were evaluated on the basis of step lengths of underlying layers. The results demonstrated that each of the samples described in Table 4 had a step length of 0.5 μm or less and had good wet etching properties (not illustrated in the table). With respect to residues at etched portions, observation with an optical microscope (observation magnification: ×400) revealed that residues were not formed in any sample.

TABLE 4

| | Structure of thin film, *values given in parentheses represent thicknesses | |
|---|---|---|
| No. | Second layer (X) | First layer (Y) |
| 1 | Pure Cu (250 nm) | Cu—10 at % Ni alloy (50 nm) |
| 2 | Pure Cu (250 nm) | Cu—10 at % Al alloy (50 nm) |
| 3 | Pure Cu (250 nm) | Cu—10 at % Mn alloy (50 nm) |
| 4 | Pure Cu (250 nm) | Cu—10 at % Ca alloy (50 nm) |
| 5 | Pure Cu (250 nm) | Cu—10 at % W alloy (50 nm) |
| 6 | Pure Cu (250 nm) | Cu—10 at % Nb alloy (50 nm) |
| 7 | Pure Cu (280 nm) | Cu—10 at % Al alloy (20 nm) |
| 8 | Pure Cu (200 nm) | Cu—10 at % Al alloy (100 nm) |
| 9 | Pure Cu (100 nm) | Cu—10 at % Al alloy (200 nm) |
| 10 | Pure Cu (250 nm) | Cu—1 at % Zn alloy (50 nm) |
| 11 | Pure Cu (250 nm) | Cu—2 at % Zn alloy (50 nm) |
| 12 | Pure Cu (250 nm) | Cu—5 at % Zn alloy (50 nm) |
| 13 | Pure Cu (290 nm) | Cu—4 at % Zn alloy (10 nm) |
| 14 | Pure Cu (280 nm) | Cu—4 at % Zn alloy (20 nm) |
| 15 | Pure Cu (250 nm) | Cu—4 at % Zn alloy (50 nm) |
| 16 | Pure Cu (200 nm) | Cu—10 at % Zn alloy (100 nm) |

Example 4

In this example, Zn was used as an added element for Cu alloys. Samples were produced as described below. The adhesion and the electrical resistivity of the samples immediately after deposition and when heat treatment was performed in a vacuum atmosphere at 350° C. for 30 minutes after the deposition were studied.

In this example, samples each including a 300-nm-thick single Cu—Zn alloy film serving as a Cu alloy film were used. The Cu alloy film in the present invention has a stacked structure of the first layer (Y) and the second layer (X). Studying the adhesion of the Cu alloy film which has a single-layer structure and which is assumed to be the composition of the Cu alloy in the first layer (Y) to the oxygen-containing insulator layer (SiO$_2$ film) and the electrical resistivity is useful to check the tendency of the effect of improving the adhesion of the added element of the first layer (Y) in the stacked structure and the electrical resistivity of the Cu alloy film in the stacked structure.

Each of the samples was produced as follows: A pure Cu sputtering target was prepared. Pure Zn metal chips were mounted on the target. The single Cu—Zn alloy film having a desired composition and having a thickness of 300 nm was formed with the resulting target. A pure Cu film was formed with a pure Cu sputtering target to provide a reference sample. Other conditions for the production of the samples are the same as those in Example 1.

With respect to each of the resulting samples, the adhesion to the SiO$_2$ film and the electrical resistivity of the Cu alloy film were measured.

With respect to the adhesion to the SiO$_2$ film, adhesion immediately after the deposition and adhesion when heat treatment was performed in a vacuum atmosphere at 350° C.

for 30 minutes after the deposition were measured. The measurement of adhesion was performed as in Example 1, except that the peeling angle of the tape was 60°.

With respect to the electrical resistivity, an electrical resistivity evaluation pattern was formed as in Example 1. The electrical resistivity was measured immediately after deposition and after subjecting each sample to heat treatment for 30 minutes at 350° C., 400° C., or 450° C.

Figure 13:
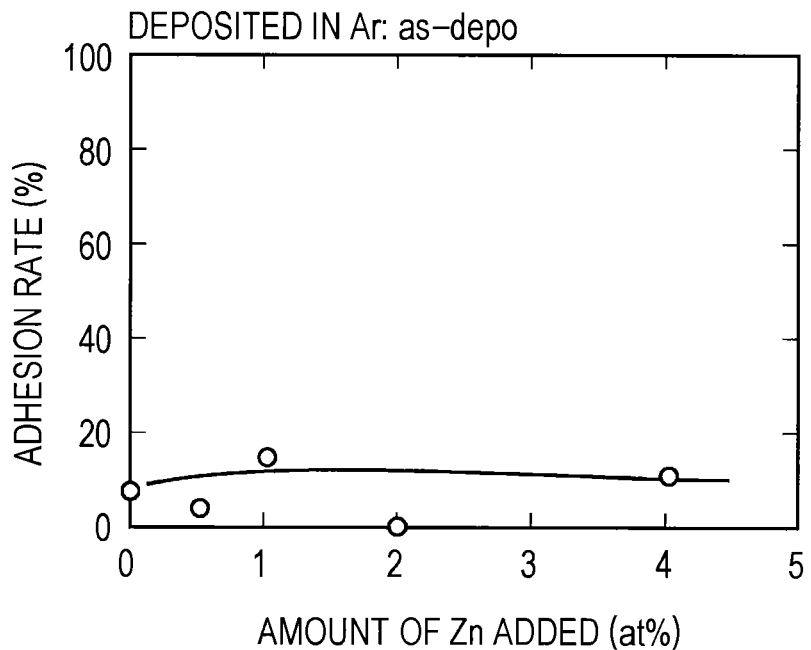
FIG. 13 is a graph illustrating the relationship between the amount of an added element (Zn) added and adhesion immediately after deposition in Example 4.
Figure 14:
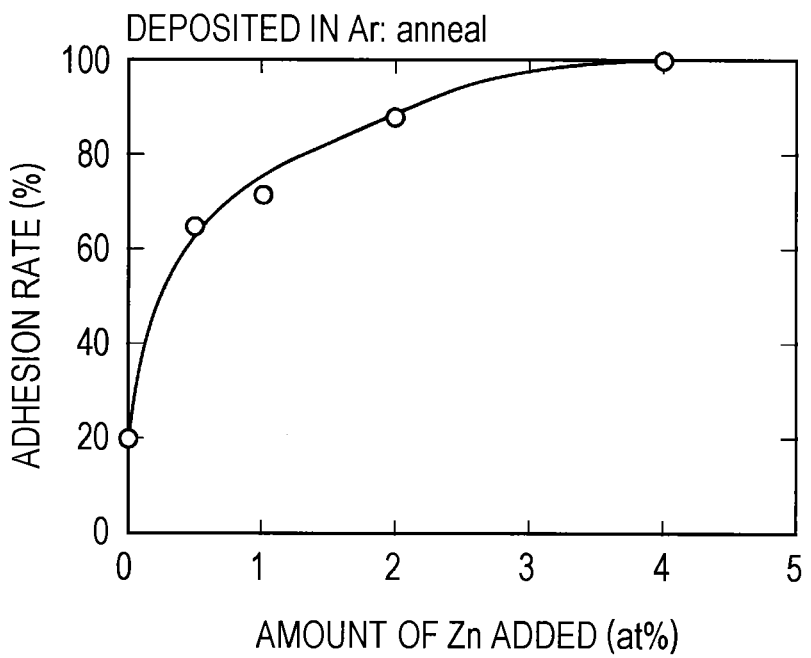
FIG. 14 is a graph illustrating the relationship between the amount of the added element (Zn) added and adhesion after heat treatment in Example 4.
Figure 15:
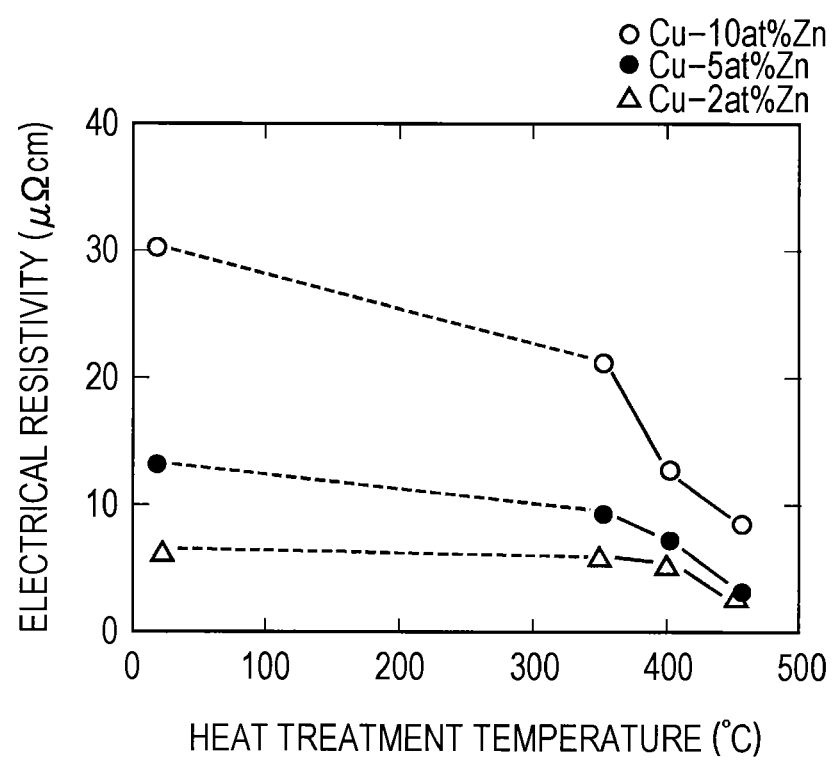
FIG. 15 is a graph illustrating the relationships among the amount of the added element (Zn) added, the heat treatment temperature, and the electrical resistivity in Example 4.

The results of the adhesion were illustrated in FIGS. 13 and 14, and the results of the electrical resistivity were illustrated in FIG. 15.

FIGS. 13 and 14 demonstrated that the heat treatment after the deposition improved the adhesion. It was also found that after the heat treatment, a Zn content of about 1.2 atomic percent or more resulted in a high adhesion rate of about 80% or more.

FIG. 15 demonstrates that while the electrical resistivity of the Cu alloy film increases as the amount of Zn added decreases, the heat treatment is performed to achieve low electrical resistivity, which is practically usable.

The results illustrated in FIGS. 13 to 15 demonstrated that while an increase in the amount of the added element in the Cu alloy film improved the adhesion, the electrical resistivity was increased. In the case where the stacked structure of the underlying layer formed of the Cu alloy film containing a predetermined amount or more of the added element and the upper layer composed of pure Cu or the like is used, the improvement of adhesion and the reduction in electrical resistivity are both achieved. Furthermore, the adjustment of the thickness of the Cu alloy underlying layer controls the balance between the adhesion and the electrical resistivity.

While the present application has been described in detail with reference to specific embodiments, it will be understood by those skilled in the art that various changes and modifications can be made without departing from the spirit and scope of the present invention.

This application claims the benefit of Japanese Patent Application No. 2010-164385 filed Jul. 21, 2010, which is hereby incorporated by reference herein in its entirety.

INDUSTRIAL APPLICABILLITY

The Cu alloy film for a display device according to the present invention includes a Cu alloy film (interconnection film) having a stacked structure of the first layer (Y) and the second layer (X), the first layer (Y) being composed of a Cu alloy containing a predetermined element having excellent adhesion to the oxygen-containing insulator layer, and the second layer (X) being composed of pure Cu or a Cu alloy having lower electrical resistivity than the first layer (Y). Furthermore, the thickness of the first layer (Y) is appropriately controlled in relation to the element. Thus, high adhesion to the oxygen-containing insulator layer and low electrical resistivity of the entire Cu alloy film are both achieved. With respect to the adhesion, in particular, when the added element in the first layer (Y) is Mn, more good adhesion is achieved by the following method: (a) the thickness of the first layer (Y) and the Mn content of the first layer (Y) are appropriately controlled, and (b) when the oxygen-containing insulator layer is composed of silicon oxide (SiOx) or silicon oxynitride (SiON) formed by a CVD method, the contents of Mn, O, and N in the first layer (Y) are appropriately controlled. Furthermore, the Cu alloy film used in the present invention has a stacked structure of pure Cu and the Cu alloy, which are similar material. Thus, the etching rates are not significantly different from each other. The use of the Cu alloy film enables micro-processing in which patterning is easily performed to provide an excellent shape.

REFERENCE SIGNS LIST 1a glass substrate
5 transparent conductive film (pixel electrode, ITO film)
25 scanning line
26 gate interconnection (gate electrode)
27 SiOx film (gate insulating film)
28 source interconnection (source electrode)
29 drain interconnection (drain electrode)
30 silicon nitride film (protective film)
31 photoresist
32 contact hole
(X) second layer
(Y) first layer

The invention claimed is:

1. A Cu alloy film, comprising:
a stacked structure comprising
a first layer Y comprising a Cu alloy, wherein the Cu alloy comprises at least one element selected from the group consisting of Zn, Ni, Ti, Al, Mg, Ca, W, Nb, and Mn in a total content of 1.2 to 20 atomic percent; and
a second layer X comprising pure Cu or a Cu alloy mainly comprising Cu, the Cu alloy having a lower electrical resistivity than the first layer Y,
wherein
the Cu alloy film is obtained after a heat treatment,
at least a part of the first layer Y is in direct contact with an oxygen-comprising insulator layer formed on a substrate,
wherein the first layer Y is free of oxygen
when the first layer Y comprises Zn or Ni, the first layer Y has a thickness of 10 nm or more and 100 nm or less, and
when the first layer Y comprises no Zn or Ni, the first layer Y has a thickness of 12 nm or more and 100 nm or less.

2. The Cu alloy film of claim 1, wherein the thickness of the first layer Y is 60% or less of an entire thickness of the Cu alloy film.

3. The Cu alloy film of claim 1, wherein
the first layer Y comprises Mn,
the oxygen-comprising insulator layer comprises silicon oxide or silicon oxynitride formed by a CVD method, and
formula (1) is satisfied:

$$2 \leq \{[O] \times [Mn] \times 1.6/([O]+[N])\} \quad (1)$$

where
[Mn] represents an Mn content of the first layer Y, in atomic percent,
[O] represents an oxygen content of the oxygen-comprising insulator layer, in atomic percent, and
[N] represents a nitrogen content of the oxygen-comprising insulator layer, in atomic percent.

4. The Cu alloy film of claim 1, wherein
the first layer Y comprises Mn, and
the thickness TM of the first layer and the Mn content satisfy formula (2):

$$TM \geq 230 \times \{[Mn] \times 1.6\}^{-1.2} \quad (2)$$

where
TM represents the thickness of the first layer Y, in nm, and
[Mn] represents the Mn content of the first layer Y, in atomic percent.

5. The Cu alloy film of claim 1, wherein the Cu alloy film is heat-treated at 250° C. or higher for 5 minutes or more.

6. The Cu alloy film of claim 1, wherein the oxygen-comprising insulator layer comprises Si.

7. The Cu alloy film of claim 1, wherein the oxide-comprising insulator layer comprises silicon oxide or silicon oxynitride.

8. The Cu alloy film of claim 1, wherein the Cu alloy film has excellent wet etching properties.

9. A display device comprising the Cu alloy film of claim 1.

10. The Cu alloy film of claim 1, wherein the first layer Y comprises Zn or Ni.

11. The Cu alloy film of claim 1, wherein the first layer Y comprises no Zn or Ni.

12. The Cu alloy film of claim 1, wherein the second layer X comprises Cu and Ni.

13. The Cu alloy film of claim 1, wherein the second layer X comprises Cu and Zn.

14. The Cu alloy film of claim 1, wherein the second layer X comprises Cu and Mn.

15. The Cu alloy film of claim 1, wherein the first layer Y comprises Mn.

16. The Cu alloy film of claim 1, wherein the first layer Y comprises Ni.

17. The Cu alloy film of claim 1, wherein the Cu alloy of the first layer Y comprises at least one element selected from the group consisting of Zn, Ni, Ti, Al, Mg, Ca, W, Nb, and Mn, in a total content of 4 to 12 atomic percent.

18. The Cu alloy film of claim 1, wherein the Cu alloy of the first layer Y further comprises Fe, Co, or both.

19. The Cu alloy film of claim 1, wherein the thickness of the first layer Y is 15% to 60% of an entire thickness of the Cu alloy film.

* * * * *